United States Patent
Li et al.

(10) Patent No.: US 11,693,654 B2
(45) Date of Patent: Jul. 4, 2023

(54) EMBEDDED GPU-BASED WIDEBAND PARALLEL CHANNELIZED RECEIVING METHOD

(71) Applicant: CHONGQING UNIVERSITY OF POSTS AND TELECOMMUNICATIONS, Chongqing (CN)

(72) Inventors: Guojun Li, Chongqing (CN); Feixiang Tian, Chongqing (CN); Changrong Ye, Chongqing (CN); Zunli Wang, Chongqing (CN); Yiping Luo, Chongqing (CN)

(73) Assignee: CHONGQING UNIVERSITY OF POSTS AND TELECOMMUNICATIONS, Chongqing (CN)

( * ) Notice: Subject to any disclaimer, the term of this patent is extended or adjusted under 35 U.S.C. 154(b) by 0 days.

(21) Appl. No.: 17/919,984

(22) PCT Filed: Feb. 1, 2021

(86) PCT No.: PCT/CN2021/074646
§ 371 (c)(1),
(2) Date: Oct. 19, 2022

(87) PCT Pub. No.: WO2021/253840
PCT Pub. Date: Dec. 23, 2021

(65) Prior Publication Data
US 2023/0161586 A1    May 25, 2023

(30) Foreign Application Priority Data
Jun. 16, 2020   (CN) .......................... 202010548596.4

(51) Int. Cl.
*H04B 1/06*    (2006.01)
*G06F 8/76*    (2018.01)
(Continued)

(52) U.S. Cl.
CPC ................ *G06F 8/76* (2013.01); *G06F 17/16* (2013.01); *H03H 17/0266* (2013.01); *H03H 17/0273* (2013.01); *H04B 1/06* (2013.01)

(58) Field of Classification Search
CPC ...................... H03H 17/0275; H03H 17/0273; G06F 17/16; G06F 8/76; H04B 1/06
(Continued)

(56) References Cited

U.S. PATENT DOCUMENTS 10,615,800 B1   4/2020   Chen et al.
11,125,888 B2 *  9/2021   Agee ..................... H04B 1/0071
(Continued)

FOREIGN PATENT DOCUMENTS

| CN | 104463324 A | 3/2015 |
| CN | 110110844 A | 8/2019 |
| CN | 111786688 A | 10/2020 |

OTHER PUBLICATIONS

International Search Report for PCT/CN2021/074646 dated Apr. 21, 2021, ISA/CN.
(Continued)

*Primary Examiner* — Emmanuel Bayard
(74) *Attorney, Agent, or Firm* — Yue (Robert) Xu; Apex Attorneys at Law, LLP (57) ABSTRACT

An embedded GPU-based wideband parallel channelized receiving method includes: constructing an OpenCL platform; decimating a wideband signal read in the OpenCL platform at an interval indicated by the number of channels; assigning data in each row to one of multiple work groups for processing; filtering data on each of channels based on a
(Continued)

coefficient of a polyphase filter on a branch; multiplying the filtered data by a factor; and performing an FFT on the formed two-dimensional matrix by columns to obtain data outputted from each of the channels.

7 Claims, 7 Drawing Sheets

(51) Int. Cl.
　　　*G06F 17/16*　　　(2006.01)
　　　*H03H 17/02*　　　(2006.01)
(58) Field of Classification Search
　　　USPC .............................. 375/140–147, 260, 267
　　　See application file for complete search history.

(56) References Cited

U.S. PATENT DOCUMENTS

2005/0276335 A1\* 12/2005 Kumar ............... H03H 17/0273
　　　　　　　　　　　　　　　　　　　　　　370/210
2023/0084904 A1\* 3/2023 Montalvo ................ G06N 5/04

OTHER PUBLICATIONS

Huang, Letian, et al., FPGA Heterogeneous Computing: Development Method based on OpenCL; ISBN:978-7-5606-3770-9, Jul. 31, 2015 (Jul. 31, 2015), pp. 14-16.

\* cited by examiner

EMBEDDED GPU-BASED WIDEBAND PARALLEL CHANNELIZED RECEIVING METHOD

The present application is a national phase application of PCT international patent application PCT/CN2021/074646, filed on Feb. 1, 2021 which claims priority to Chinese Patent Application No. 202010548596.4, titled "EMBEDDED GPU-BASED WIDEBAND PARALLEL CHANNELIZED RECEIVING METHOD", filed on Jun. 16, 2020 with the China National Intellectual Property Administration, all of which are incorporated herein by reference in their entireties.

FIELD

The present disclosure relates to the technical field of communications, and in particular to an embedded GPU-based wideband parallel channelized receiving method.

BACKGROUND

A variety of efficient digital channelized structures are proposed in communications in order to receive multiple signals in a wideband signal in parallel, so as to channelize the wideband signal of an entire sampling bandwidth, such that multiple signals are acquired at the same time, thereby achieving reception of total probability. At present, the efficient digital channelized structures are mostly implemented based on the DSP platform and FPGA that are not portable and have high development costs.

With its increasing programmability, the GPU is no longer limited to graphics rendering. Researches on applications of GPU in general computing is increasingly active. The use of GPU for computing in fields other than graphics rendering is called general purpose computing on graphics processing units (GPGPU). Successful migration of fields with extremely high computing density, large number of concurrent threads and frequent memory accesses to the GPU-based computing platform may lead to more efficient solutions.

Based on the current researches, a parallel processing method based on an embedded low-power GPU is proposed to realize the channelized structure of polyphase DFT. Parallel programming is performed on the OpenCL framework. The abstraction and interface in the OpenCL standard allow programmers to seamlessly run applications on a variety of heterogeneous devices from one or more manufacturers, with good portability. The OpenCL is basically integrated in all the X86 systems, rather than limited to Mac, Ubuntu, Windows, Android and other operating systems.

SUMMARY

Figure 1:
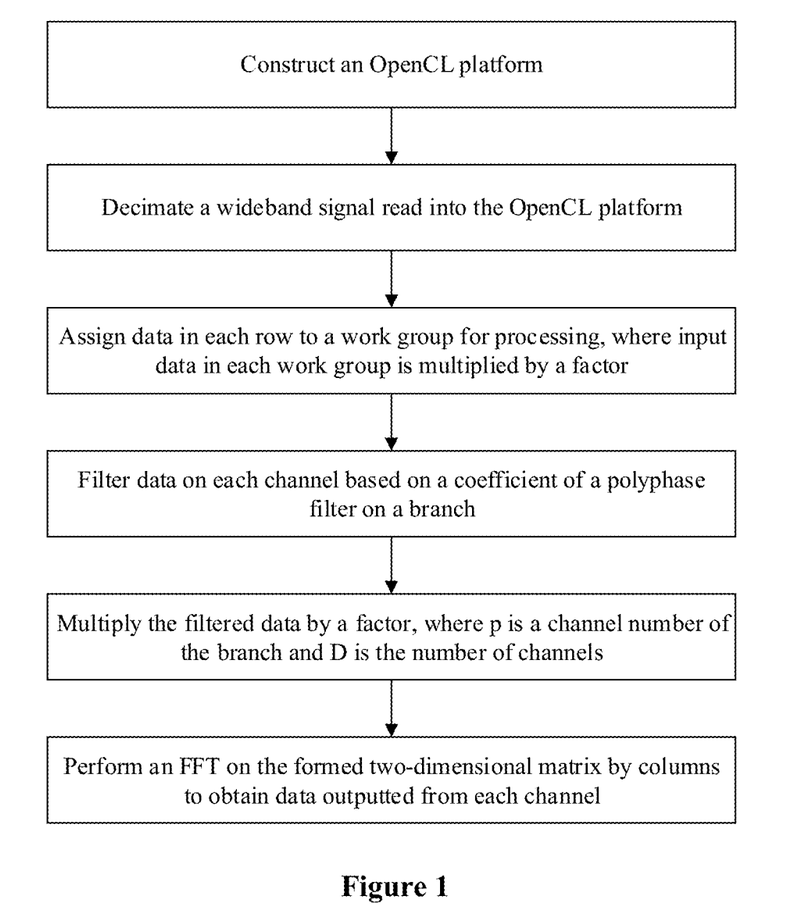
FIG. 1 is a flow chart illustrating an embedded GPU-based wideband parallel channelized receiving method.

In view of the disadvantages of poor portability, inconvenient for carrying and high development cost resulted from the existing wideband digital channelized receivers mostly implemented on DSP and FPGA platforms. An embedded GPU-based wideband parallel channelized receiving method is provided according to the present disclosure. Referring to FIG. 1, the method includes: constructing an OpenCL platform, where the OpenCL platform includes a host computer and multiple OpenCL devices, each OpenCL device includes multiple computing units, each of the multiple computing units includes multiple work groups and multiple processing elements, and each of the multiple processing elements serves as a work item; decimating a wideband signal read in the OpenCL platform at an interval indicated by the number of channels, where a two-dimensional matrix is formed by decimating a one-dimensional data that is originally read, and the number of rows of the two-dimensional matrix is equal to the number of channels; assigning data in each row to one of the multiple work groups for processing, where input data in each work group is multiplied by a factor $(-1)^m$, and m indicates a serial number of a column where the data is located; filtering data on each of the channels based on a coefficient of a polyphase filter on a branch; multiplying the filtered data by a factor $$e^{-j\pi\frac{p}{D}},$$

where p indicates a channel number of the branch and D indicates the number of channels; and performing an FFT on the formed two-dimensional matrix by columns to obtain data outputted from each of the channels.

Further, primary, secondary and tertiary channelized processing are performed on the read wideband signal. In a case of $2^N$ signal points read each time, the $2^N$ signal points are distributed among 16 channels with $2^N/16$ signal points on each of the 16 channels after the primary channelized processing, are distributed among 256 channels with $2^N/256$ signal points on each of the 256 channels after the secondary channelized processing, and are distributed among 2048 channels with $2^N/2048$ signal points on each of the 2048 channels after the tertiary channelized processing.

Further, the decimating a wideband signal includes: dividing a wideband signal x(n) into signals respectively on K channels; and for each of the K channels, down-conversion processing the signal on the channel, so that the signal is transmitted to a baseband; processing the signal by a low-pass filter; and decimating the signal by a decimator to change a data rate, to obtain the signal on this channel, where a signal decimated on a kth channel is expressed as $$y_k(m) = \sum_{p=0}^{D-1} \{x_p(m)\cdot(-1)^m\} * h_p(m)\cdot e^{-j\frac{\pi p}{D}}\cdot e^{-j\frac{2\pi}{D}kp},$$

where $y_k(m)$ denotes the signal decimated on the kth channel, $x_p(m)$ denotes a decimated p-th branch in the signal on the kth channel, $h_p(m)$ denotes a branch filter in a p-th polyphase filter structure for an input signal on the kth channel, and * denotes convolution.

Further, a relationship between the inputted wideband signal x(n) and a branch signal $x_p(m)$ is expressed as $x_p(n)=x(nD-p)$, and a relationship between a low-pass filter $h_{LP}(m)$ and a branch filter $h_p(m)$ is expressed as $h_p(n)=h_{LP}(nD+p)$ where p=0,1,⋯ D−1 and D denotes the number of channels.

Further, the filtering data includes performing convolution of an input signal on the branch and a polyphase component on the branch, where the filtering on each branch is performed by the plurality of work groups, a plurality of work items are assigned to each of the plurality of work groups, each of the plurality of work items is for performing computing corresponding to one output, and convolution is expressed as:

$$y[n] = x[n] * h[n]$$

$$= \sum_{k=-\infty}^{\infty} x[k] \cdot h[n-k]$$

where x[n] denotes an input of an n-th work item, h[n−k] denotes a channel corresponding to the n-th work item, and y[n] denotes an output of the n-th work item.

Further, the performing an FFT on the formed two-dimensional matrix by columns includes: for a 16-point FFT of the primary channelized processing, assigning 128 work groups, assigning 16 work items to each of the 128 work groups, and performing synchronization in each of the 128 work groups after computation; for a 16-point FFT of the secondary channelized processing, assigning 16 work groups, assigning 16 work items to each of the 16 work groups, and performing synchronization in each of the 16 work groups after computation; and for an 8-point FFT of the tertiary channelized processing, assigning 1 work group and assigning 16 work items to the work group, performing synchronization in the work group after computation and outputting a computation result.

Further, the FFT is a butterfly computation, which includes grouping input data by parity, and acquiring a computation result of the FFT based on reducibility and periodicity of a twiddle factor. The computation result of the FFT is expressed as:

$$X(k) = X_1(k) + W_N^k X_2(k)$$
$$0 \le k \le \frac{N}{2} - 1$$
$$X\left(k + \frac{N}{2}\right) = X_1(k) - W_N^k X_2(k)$$

where $X_1(k)$, $X_2(k)$ denote sequences obtained from an input sequence x(k) grouped by parity and then subjected to a N/2-point DFT, $W_N^k$ denotes the twiddle factor, and N denotes a signal point to be processed.

The present disclosure may be implemented on portable embedded devices such as smart phones and tablet computers, and has advantages of portability and low power consumption. Further, thanks to the feature that channels in the channelized structure of polyphase DFT support processing separately, parallel programming is performed on the OpenCL framework, and multiple work groups in the GPU are set to be performed in parallel so as to process computing tasks of multiple channels at the same time, thereby improving processing efficiency. Further, the OpenCL framework is capable of running on GPU, CPU, DSP, FPGA and heterogeneous acceleration processing units, and supports Mac, Ubuntu, Windows, Android and other operating systems, with good portability.

DETAILED DESCRIPTION OF EMBODIMENTS

The technical solutions in the embodiments of the present disclosure are described clearly and completely in conjunction with the drawings in the embodiments of the present disclosure hereinafter. It is apparent that the described embodiments are only some rather than all embodiments of the present disclosure. Based on the embodiments of the present disclosure, all other embodiments obtained by those skilled in the art without any creative efforts fall within the protection scope of the present disclosure.

An embedded GPU-based wideband parallel channelized receiving method is provided according to the present disclosure. Referring to FIG. 1, the method includes: constructing an OpenCL platform, where the OpenCL platform includes a host computer and multiple OpenCL devices, each OpenCL device includes multiple computing units, each of the multiple computing units includes multiple work groups and multiple processing elements, and each of the multiple processing elements serves as a work item; decimating a wideband signal read in the OpenCL platform at an interval indicated by the number of channels, where a two-dimensional matrix is formed by decimating a one-dimensional data that is originally read, and the number of rows of the two-dimensional matrix is equal to the number of channels; assigning data in each row to one of the multiple work groups for processing, where input data in each work group is multiplied by a factor $(-1)^m$, and m indicates a serial number of a column where the data is located; filtering data on each of the channels based on a coefficient of a polyphase filter on a branch; multiplying the filtered data by a factor $$e^{-jn\frac{p}{D}},$$

where p indicates a channel number of the branch and D indicates the number of channels; and performing an FFT on the formed two-dimensional matrix by columns to obtain data outputted from each of the channels.

First Embodiment

Figure 2:
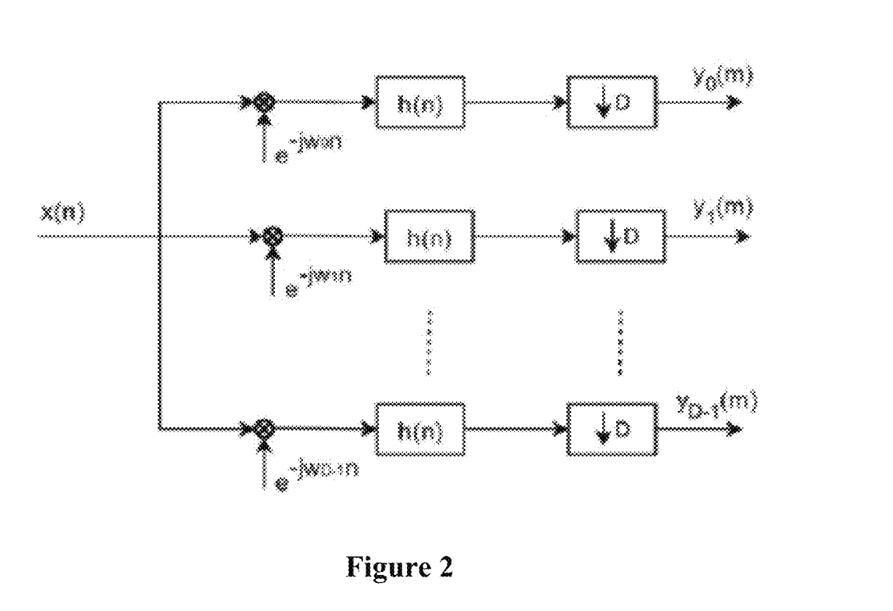
FIG. 2 illustrates a digital channelized structure based on a traditional low-pass filter bank.

The traditional digital channelized structure is based on the low-pass filter bank. Referring to FIG. 2, the structure divides a wideband signal x(n) into signals respectively on K channels. The signal on each channel is transmitted to a baseband by down-conversion processing, then is processed by the low-pass filter, and finally is decimated by a decimator to change a data rate so as to obtain the signal on this channel. The digital channelized structure based on the low-pass filter bank is denoted as:

$$y_k(m) = \{[x(n)e^{jw_k n}] * h_{LP}(n)\}|_{n=mD};$$

where, $h_{LP}(n)$ denotes the low-pass filter.

The above formula is expanded as:

$$y_k(m) = \{[x(n)e^{jw_k n}] * h_{LP}(n)\}|_{n=mD}$$
$$= \sum_{i=-\infty}^{\infty} x(mD-i)e^{jw_k(mD-i)} \cdot h_{LP}(i)$$
$$= \sum_{p=0}^{D-1}\sum_{i=-\infty}^{\infty} x(mD-iD-p)e^{jw_k(mD-iD-p)} \cdot h_{LP}(iD+p)$$

In a case of $$x_p(m-i)=x(mD-iD-p)$$

$$h_p(i)=h_{LP}(iD+p)$$

the digital channelized structure based on the low-pass filter bank is denoted as:

$$y_k(m) = \sum_{p=0}^{D-1}\sum_{i=-\infty}^{\infty} x_p(m-i)e^{jw_k(m-i)D} \cdot h_{LP}(iD+p)$$
$$= \sum_{p=0}^{D-1}\{[x_p(m)e^{jw_k mD}] * h_p(m)\}e^{-jw_k p}$$

Further, in a case of $$w_k = \left(k - \frac{D-1}{2}\right) \cdot \frac{2\pi}{D},$$

there are expressions of:

$$e^{jw_k mD} = e^{j\left(k-\frac{D-1}{2}\right)\frac{2\pi}{D}mD} = (-1)^m, \text{ and}$$

$$e^{-jw_k p} = e^{-j\left(k-\frac{D-1}{2}\right)\frac{2\pi}{D}p} e^{-j\frac{\pi p}{D}} \cdot e^{-j\frac{2\pi}{D}kp}.$$

The above two expressions are substituted into the expression of the digital channelized structure based on the low-pass filter bank, to obtain the following mathematical expression of the polyphase DFT channelized structure:

$$y_k(m) = \sum_{p=0}^{D-1}\{x_p(m) \cdot (-1)^m\} * h_p(m) \cdot e^{-j\frac{\pi p}{D}} \cdot e^{-j\frac{2\pi}{D}kp}.$$

Figure 3:
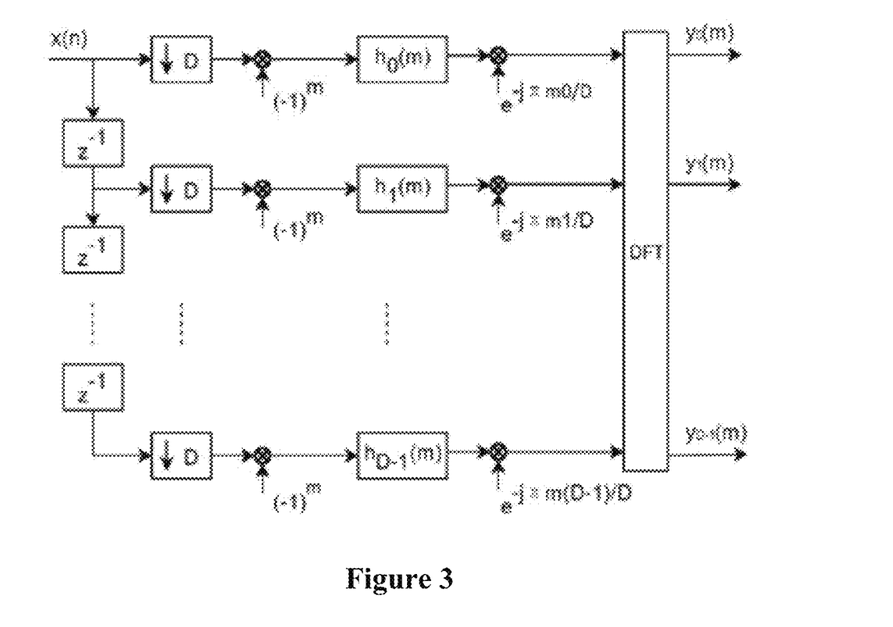
FIG. 3 illustrates a polyphase DFT channelized structure according to the present disclosure.

$x_p(m)$ denotes the decimated input signal, and $h_p(m)$ denotes a branch filter of the polyphase filter structure. The polyphase DFT channelized structure as shown in FIG. 3 is obtained from the above expressions.

The relationship between a branch signal $x_p(n)$ and the input signal $x(n)$, and the relationship between a branch filter $h_p(n)$ and the prototype low-pass filter $h_{LP}(n)$ are expressed as follows:

$$x_p(n)=x(nD-p)$$

$$h_p(n)=h_{LP}(nD+p), p=0,1,\ldots D-1$$

Therefore, the data on the branch and the coefficient of the branch filter are obtained by delaying each input signal and the coefficient of the prototype low-pass filter respectively, which greatly simplifies computation, improves the processing efficiency and is easy to be implemented in engineering.

Second Embodiment

Figure 4:
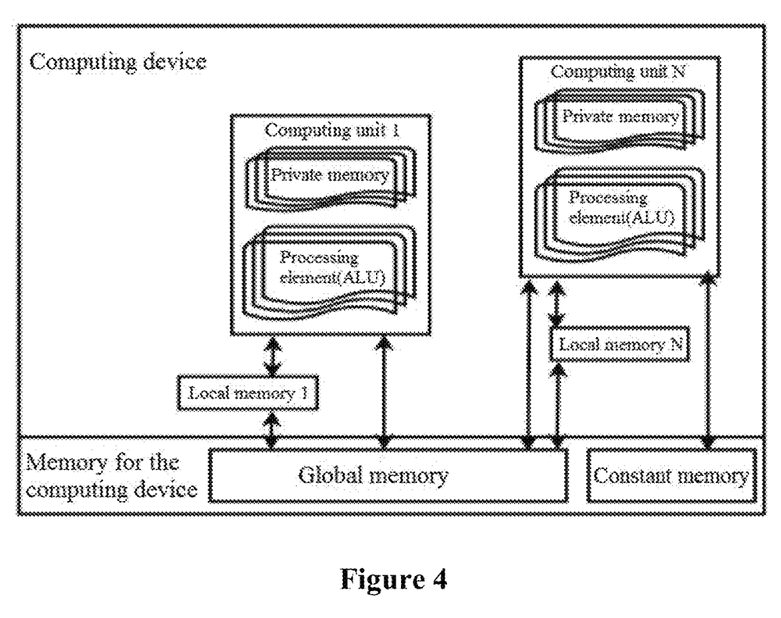
FIG. 4 is a structure diagram illustrating an OpenCL platform according to the present disclosure.

As shown in FIG. 4, in an OpenCL platform model, an OpenCL device includes multiple computing units. Each computing unit includes multiple processing elements, which are also called work items. Computing tasks of the OpenCL are performed by these processing elements independent of each other. Depending on access permissions of threads, each pressing element has access to four storage spaces with different permissions: a private memory, a local memory, a constant memory and a global memory. Usage mode of the four storage spaces in a program largely determines the performance of the program. Generally, the four storage spaces are different in size and access speed.

The wideband digital channelized receiver according to this embodiment divides a wideband signal with a bandwidth of 6.144 MHz into signals respectively on 2048 channels by 3 KHz. Due to the large number of channels, the use of single channelized processing relies on a large filter order, which is not conducive to improvement in the computing efficiency. Therefore, primary, secondary and tertiary channelized processing are adopted according to the present disclosure. The primary and secondary channelized processing each generate 16 channels, and the tertiary channelized processing generates 8 channels. In this way, the filter coefficient in each channelized processing is greatly reduced, thereby improving the processing efficiency.

Figure 5:
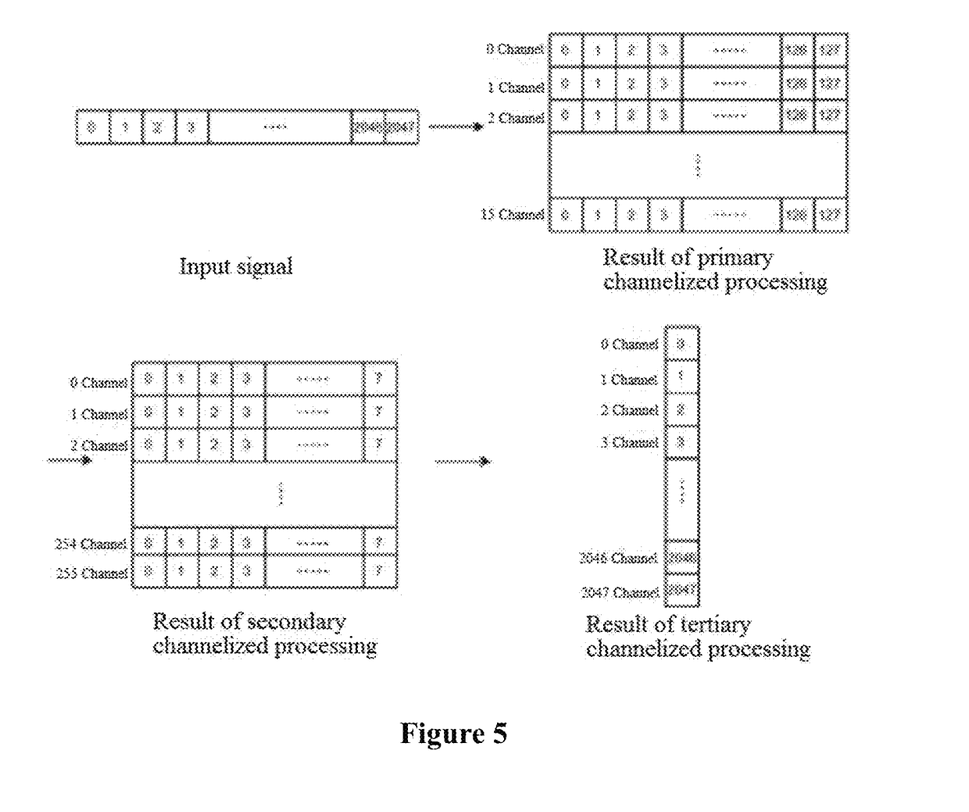
FIG. 5 illustrates a variation on an input signal subjected to primary, secondary and tertiary channelized processing according to the present disclosure.

In practice, the program reads 2048 signal points from the wideband signal each time. The 2048 signal points is subjected to the primary channelized processing and distributed on 16 channels. 128 signal points are on each channel. Then, the 128 signal points on each channel is subjected to the secondary channelized processing, such that all the 2048 signal points are distributed on 256 channels. 8 signal points are on each channel. Finally, the 8 signal points on each channel is subjected to the tertiary channelized processing, such that all the 2048 signal points are distributed on 2048 channels. 1 signal point on each channel. The variation on the input signal subjected to primary, secondary and tertiary channelized processing is shown in FIG. 5. Alternatively, the number of signal points read each time may be other number than 2048, for example, an integer power of 2, such as 4096.

In the polyphase DFT channelized structure, the filtering processing on each branch is essentially the convolution of the input signal on the branch and a polyphase component on the branch. The convolution is expressed as:

$$y[n] = x[n] * h[n]$$
$$= \sum_{k=-\infty}^{\infty} x[k] \cdot h[n-k]$$

In the OpenCL platform, filtering on each branch is performed by a work group. There are 16 work groups corresponding to the parallel processing according to the present disclosure. Each of the 16 work groups has 128 work items. Each work item performs computation for one output. For example, a work item 0 performs the following computation:

$$y[0] = \sum_{k=-\infty}^{\infty} x[0] \cdot h[0-k];$$

and a work item 1 performs the following computation:

$$y[1] = \sum_{k=-\infty}^{\infty} x[1] \cdot h[1-k].$$

In this way, the filtering on multiple branches in the channelized structure are performed in parallel, thereby greatly reducing the delay in filtering and improving the processing efficiency.

Third Embodiment

In the polyphase DFT channelized structure, the signal points on each channel is subjected to DFT to obtain a channelized processing result on the channel. In the present disclosure, the fast Fourier transform FFT instead of the DFT is adopted to improve computing efficiency.

The input data for the DFT is grouped by parity, and the expression of the FFT is derived based on reducibility and periodicity of a twiddle factor. The expression of the FFT is as follows.

$$X(k) = X_1(k) + W_N^k X_2(k)$$
$$0 \le k \le \frac{N}{2} - 1$$
$$X\left(k + \frac{N}{2}\right) = X_1(k) - W_N^k X_2(k)$$

$X_1(k)$, $X_2(k)$ denote sequences obtained from an input sequence x(k) grouped by parity and then subjected to a N/2-point DFT. $W_N^k$ denotes the twiddle factor. N denotes a signal point to be processed. The DFT can be effectively simplifies by division. Since N is a positive integer power of 2, the N/2-point DFT is divided until 2-point DFT is obtained, which is called a butterfly.

Figure 6:
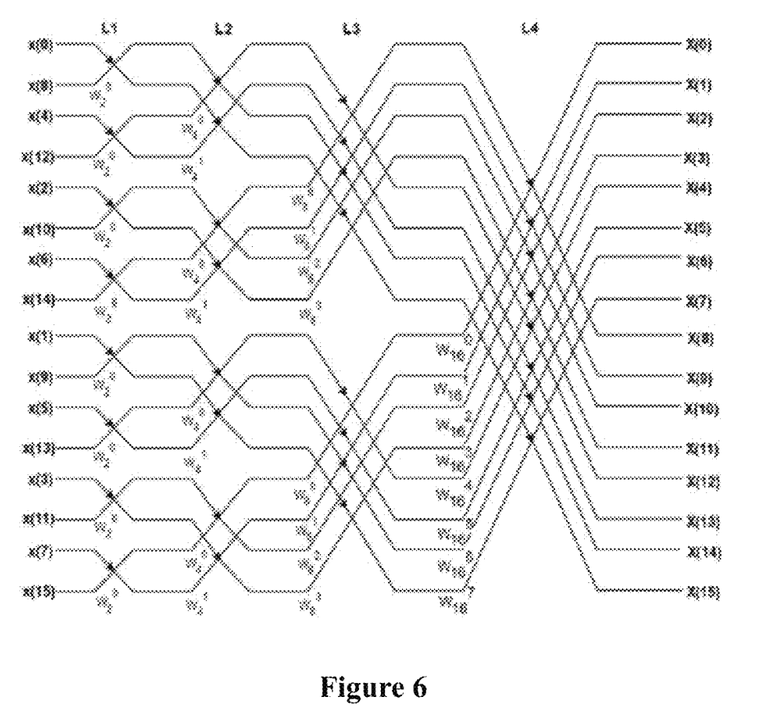
FIG. 6 illustrates a 16-point FFT processing in a work group according to the present disclosure.

The primary, secondary and tertiary channelized processing are adopted according to the present disclosure. After the primary channelized processing, a read signal is distributed among 16 channels. After the secondary channelized processing, the signal on each of the 16 channels is the distributed. The tertiary channelized processing is similar to the secondary channelized processing. Since the primary and secondary channelized processing each requires 16 channels, 16-point FFT is performed for the primary and secondary channelized processing. A butterfly diagram of the 16-point FFT is shown in FIG. 6.

In order to perform a 16-point FFT of the primary channelized processing on the OpenCL platform, 128 work groups are assigned, and 16 work items are assigned to each of the 128 work groups. The 16-point FFT processing in each work group is performed by the 16 work items in parallel. A synchronization operation is necessary in each work group after the FFT.

16 work groups are assigned for a 16-point FFT of the secondary channelized processing, and 1 work group is assigned for an 8-point FFT of the tertiary channelized processing. 16 work items are assigned to each work group so as to perform computing tasks.

The synchronization operation is to allow all the work items in the work group to complete their respective computing tasks, reach a synchronization point and then perform a next computing task, such that the algorithm is orderly executed. With the OpenCL platform, the FFT is performed by multiple work items in parallel, thereby greatly improving the processing efficiency of the FFT and further improving the real-time performance of the system.

Fourth Embodiment

In the present disclosure, the wideband signal with a bandwidth of 6.144 MHz is divided into signals respectively on 2048 channels by 3 KHz. In the present disclosure, a frequency band of a short-wave is selected for testing. The short-wave has a frequency ranging from 3 MHz to 30 MHz, which meets the bandwidth requirements according to the present disclosure. A real wideband signal may be acquired by the software-defined radio SDRplay.

The software-defined radio SDRplay converts a high-frequency wideband signal into a zero intermediate frequency signal totally, so as to obtain the wideband signal. In the test according to the present disclosure, a center frequency for acquisition by the SDRplay is set to 10 MHz, and a bandwidth for acquisition is set to 6.144 MHz, so that the wideband signal of 6.928 MHz-13.072 MHz is obtained. Then, the SDRplay performs down conversion processing on the wideband signal to obtain a signal of −3.072 MHz~3.072 MHz.

Figure 7:
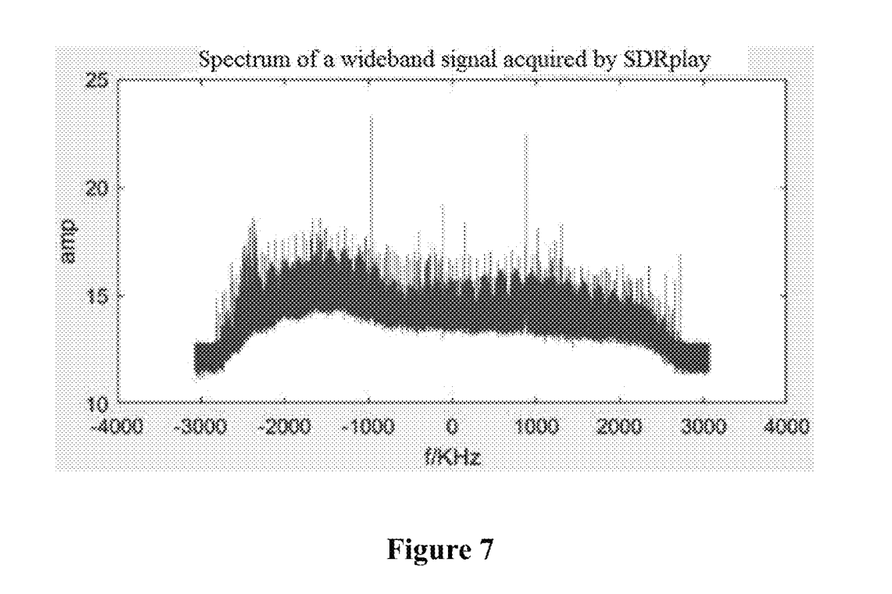
FIG. 7 illustrates a spectrum of a wideband signal acquired by SDRplay according to an embodiment of the present disclosure.

During acquisition of the wideband signal, two frequency modulation signals with carrier frequencies of 9.028 MHz and 10.9 MHz are generated by a signal generator, and then are transmitted by a power amplifier and a shortwave antenna. FIG. 7 illustrates a spectrum of the wideband signal acquired by the software-defined radio SDRplay.

Figure 8:
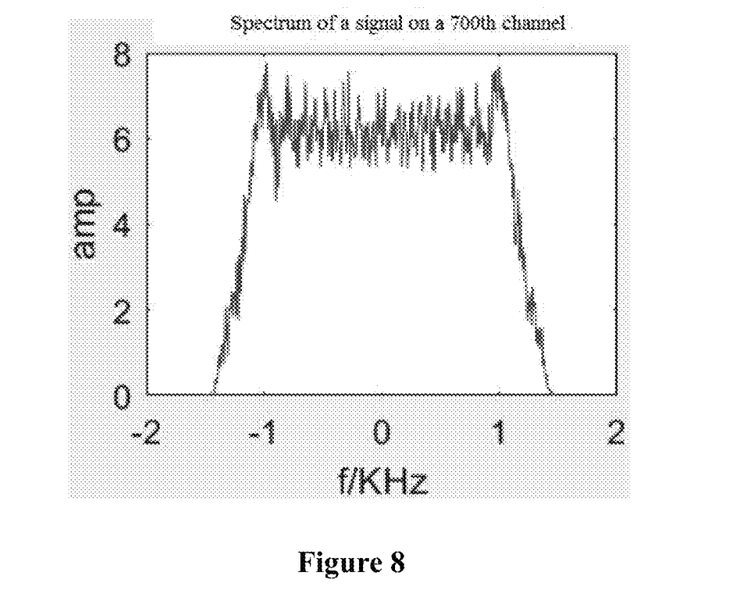
FIG. 8 illustrates a spectrum of a signal on a 700th channel after channelization according to an embodiment of the present disclosure.
Figure 9:
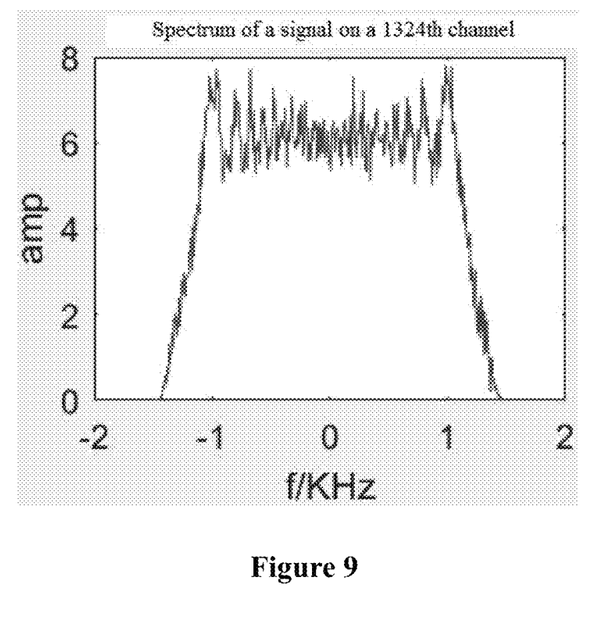
FIG. 9 illustrates a spectrum of a signal on a 1324th channel after channelization according to an embodiment of the present disclosure.

As shown in FIG. 7, the wideband signal at the zero intermediate frequency has two signals with a high amplitude at −0.972 MHz and 0.9 MHz, which are obtained by converting two test signals at 9.028 MHz and 10.9 MHz into the zero intermediate frequency. This wideband signal at the zero intermediate frequency serves as the input signal of the channelized receiver according to the present disclosure. According to frequency, −0.972 MHz and 0.9 MHz are initial frequencies of the 700th and 1324th channels respectively. The GPU with a model of AMD Radeon RX 580 is selected in the present disclosure. After the channelized processing on the GPU, signals on the two channels are obtained. Spectrums of the signals on the two channels are shown in FIGS. 8 and 9, respectively.

In the acquisition of the wideband signal by the wideband receiver SDRplay, duration is set to 200 ms. The primary channelized processing spends 32 ms, the secondary channelized processing spends 45 ms, and the tertiary channelized processing spends 120 ms. The total period of time spent by the primary, secondary and tertiary channelized processing is 197 ms. That is, the period of time spent by the channelized processing according to the present disclosure is less than the duration of the signal, thereby meeting the requirements on real-time performance.

Although the embodiments of the present disclosure have been shown and described, it should be understood that various changes, modifications, substitutions and alterations may be made to these embodiments by those skilled in the art without departing from the principle and spirit of the present disclosure. The scope of the present disclosure is limited by the appended claims and their equivalents.

The invention claimed is:

1. An embedded GPU-based wideband parallel channelized receiving method, comprising:
constructing an OpenCL platform, wherein the OpenCL platform comprises a host computer and a plurality of OpenCL devices, each of the plurality of OpenCL devices comprises a plurality of computing units, each of the plurality of computing units comprises a plurality of work groups and a plurality of processing elements, and each of the plurality of processing elements serves as a work item;

decimating a wideband signal read in the OpenCL platform at an interval indicated by the number of channels, wherein a two-dimensional matrix is formed by decimating one-dimensional data that is originally read, and the number of rows of the two-dimensional matrix is equal to the number of channels;

assigning data in each row to one of the plurality of work groups for processing, wherein input data in each of the plurality of work groups is multiplied by a factor $(-1)^m$, and m indicates a serial number of a column where the data is located;

filtering data on each of the channels based on a coefficient of a polyphase filter on a branch;

multiplying the filtered data by a factor $$e^{-j\pi \frac{p}{D}},$$

wherein p indicates a channel number of the branch and D indicates the number of channels; and performing an FFT on the formed two-dimensional matrix by columns to obtain data outputted from each of the channels.

2. The embedded GPU-based wideband parallel channelized receiving method according to claim 1, wherein primary, secondary and tertiary channelized processing are performed on the read wideband signal, wherein in a case of $2^N$ signal points read each time, the $2^N$ signal points are distributed among 16 channels with $2^N/16$ signal points on each of the 16 channels after the primary channelized processing, are distributed among 256 channels with $2^N/256$ signal points on each of the 256 channels after the secondary channelized processing, and are distributed among 2048 channels with $2^N/2048$ signal points on each of the 2048 channels after the tertiary channelized processing.

3. The embedded GPU-based wideband parallel channelized receiving method according to claim 2, wherein the decimating a wideband signal comprises:

dividing a wideband signal x(n) into signals respectively on K channels; and for each of the K channels, down-conversion processing the signal on the channel, so that the signal is transmitted to a baseband; processing the signal by a low-pass filter; and decimating the signal by a decimator to change a data rate, to obtain the signal on this channel, wherein a signal decimated on a kth channel is expressed as:

$$y_k(m) = \sum_{p=0}^{D-1} \{x_p(m) \cdot (-1)^m\} * h_p(m) \cdot e^{-j\frac{\pi p}{D}} \cdot e^{-j\frac{2\pi}{D}kp},$$

wherein $y_k(m)$ denotes the signal decimated on the kth channel, $x_p(m)$ denotes a decimated p-th branch in the signal on the kth channel, $h_p(m)$ denotes a branch filter in a p-th polyphase filter structure for an input signal on the kth channel, and * denotes convolution.

4. The embedded GPU-based wideband parallel channelized receiving method according to claim 3, wherein a relationship between the wideband signal x(n) and a branch signal $x_p(m)$ is expressed as $x_p(n)=x(nD-p)$; and a relationship between a low-pass filter $h_{LP}(m)$ and a branch filter $h_p(m)$ is expressed as $h_p(n)=h_{LP}(nD+p)$, wherein p=0,1,⋯ D−1 and D denotes the number of channels.

5. The embedded GPU-based wideband parallel channelized receiving method according to claim 2, wherein the filtering data comprises:

performing convolution of an input signal on the branch and a polyphase component on the branch, wherein the filtering on each branch is performed by the plurality of work groups, a plurality of work items are assigned to each of the plurality of work groups, each of the plurality of work items is for performing computing corresponding to one output, and the convolution is expressed as:

$$y[n] = x[n] * h[n]$$
$$= \sum_{k=-\infty}^{\infty} x[k] \cdot h[n-k]$$

wherein x[n] denotes an input of an n-th work item, h[n−k] denotes a channel corresponding to the n-th work item, and y[n] denotes an output of the n-th work item.

6. The embedded GPU-based wideband parallel channelized receiving method according to claim 2, wherein the performing an FFT on the formed two-dimensional matrix by columns comprises:

for a 16-point FFT of the primary channelized processing, assigning 128 work groups, assigning 16 work items to each of the 128 work groups, and performing synchronization in each of the 128 work groups after computation;

for a 16-point FFT of the secondary channelized processing, assigning 16 work groups, assigning 16 work items to each of the 16 work groups, and performing synchronization in each of the 16 work groups after computation; and for an 8-point FFT of the tertiary channelized processing, assigning 1 work group and assigning 16 work items to the work group, performing synchronization in the work group after computation and outputting a computation result.

7. The embedded GPU-based wideband parallel channelized receiving method according to claim 2, wherein the FFT is a butterfly computation, and the butterfly computation comprises:

grouping input data by parity, and acquiring a computation result of the FFT based on reducibility and periodicity of a twiddle factor, wherein the computation result of the FFT is expressed as:

$$X(k) = X_1(k) + W_N^k X_2(k)$$
$$0 \le k \le \frac{N}{2} - 1$$
$$X\left(k + \frac{N}{2}\right) = X_1(k) - W_N^k X_2(k)$$

wherein $X_1(k)$, $X_2(k)$ denote sequences obtained from an input sequence $x(k)$ grouped by parity and subjected to a N/2-point DFT, $W_N^k$ denotes the twiddle factor, and N denotes a signal point to be processed.

* * * * *